United States Patent
Horie et al.

(10) Patent No.: US 6,677,618 B1
(45) Date of Patent: Jan. 13, 2004

(54) COMPOUND SEMICONDUCTOR LIGHT EMITTING DEVICE

(75) Inventors: Hideyoshi Horie, Ushiku (JP); Hirotaka Ohta, Ushiku (JP); Toshinari Fujimori, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/453,279

(22) Filed: Dec. 3, 1999

(30) Foreign Application Priority Data

Dec. 4, 1998 (JP) .......................... 10-344798

(51) Int. Cl.⁷ ............................. H01L 33/00
(52) U.S. Cl. ................. 257/94; 257/59; 257/98; 372/49
(58) Field of Search .............. 257/94, 98, 59; 372/49, 44, 45, 46, 43, 48; 438/22, 29, 38, 47, 473, 474

(56) References Cited

U.S. PATENT DOCUMENTS

| | | | |
|---|---|---|---|
| 4,563,368 A | | 1/1986 | Tihanyl et al. ............ 427/82 |
| 4,656,638 A | * | 4/1987 | Tihanyi et al. ............ 372/49 |
| 5,063,173 A | | 11/1991 | Gasser et al. ............ 437/129 |
| 5,089,437 A | | 2/1992 | Shima et al. ............ 437/129 |
| 5,144,634 A | | 9/1992 | Gasser et al. ............ 372/49 |
| 5,161,166 A | | 11/1992 | Shima et al. ............ 372/45 |
| 5,171,717 A | | 12/1992 | Broom et al. ............ 437/226 |
| 5,440,575 A | | 8/1995 | Chand et al. ............ 372/49 |
| 5,469,457 A | | 11/1995 | Nagai et al. ............ 372/45 |
| 5,545,484 A | | 8/1996 | Yamaguchi et al. ........ 426/408 |
| 5,780,120 A | | 7/1998 | Belouet et al. ............ 427/554 |
| 6,057,557 A | | 5/2000 | Ichikawa ............ 257/59 |
| 6,067,310 A | * | 5/2000 | Hashimoto et al. ......... 372/49 |

FOREIGN PATENT DOCUMENTS

| | | |
|---|---|---|
| JP | 2-45992 | 2/1990 |
| JP | 3-101183 | 4/1991 |
| JP | 4-336426 | 11/1992 |
| JP | 6-302906 | 10/1994 |
| JP | 8-130344 | 5/1996 |

OTHER PUBLICATIONS

L. W. Tu et al., In–vacuum cleaving and coating of semiconductor laser facets using thin silicon and a dielectric, pp. 6448–6451, J. Appl. Phys., 80 (11), Dec. 1, 1996, (1996 American Institute of Physics).

A. Somani, et al., *Real–time Monitoring of Laser Diode Facet Reflectivity While Being Coated with SiOx*, Applied Optics, vol. 27, No. 8, pp. 1391–1393, Apr. 15, 1988.

\* cited by examiner

*Primary Examiner*—Phat X. Cao
*Assistant Examiner*—Theresa T. Doan
(74) *Attorney, Agent, or Firm*—Armstrong, Westerman & Hattori, LLP

(57) ABSTRACT

Disclosed compound semiconductor light emitting devices have a substrate, a compound semiconductor layer, formed on the substrate, containing a first conductive type clad layer, an active layer, and a second conductive type clad layer, and a resonator structure formed of two opposing facets of the compound semiconductor layer, wherein surfaces of the first conductive type clad layer, the active layer, and the second conductive type clad layer forming the facet of the compound semiconductor are covered with a passivation layer, wherein at least one element constituting the facet of the compound semiconductor layer is not coupled to oxygen, and wherein a portion of the passivation layer adjacent to the facet of the compound semiconductor layer contains oxygen as a structural element. The compound semiconductor light emitting devices according to the invention can stably suppress, for a long time, the surface state densities on the facets occurring on extrinsic causes, and are high performance devices with establishing both of a high output and a long lifetime.

28 Claims, 11 Drawing Sheets

COMPOUND SEMICONDUCTOR LIGHT EMITTING DEVICE

BACKGROUND OF THE INVENTION

1. Field of the Invention

This invention relates to semiconductor light emitting devices, particularly, semiconductor lasers. This invention can be desirably used in a case that high output and long lifetime are demanded as for excitation light sources for optical fiber amplifiers, light sources for optical information processing, and the like. This invention is also applicable to LEDs (light emitting diodes) such as super-luminescent diodes or the like in which optical output comes from their facet, vertical cavity surface emitting lasers, and the like.

2. Description of Related Art

Optical information processing technologies and optical communication technologies have remarkably progressed these days. For example, high density recording by means of magneto-optical discs, two-way communications using optical fiber networks, and the like can be exemplified but too numerous to be counted.

In the field of communication technologies, for example, active research is carried out in various quarters with respect to optical fiber transmission lines of a large capacity sufficiently coping with the upcoming multimedia era, and $Er^{3+}$-doped optical fiber amplifiers (EDFA) in which rare earth elements such as $Er^{3+}$ are doped, as amplifiers for signal amplification with flexibility to that transmission method. Under these circumstances, developments of highly efficient semiconductor lasers for excitation light source, as a essential component for EDFA, have been sought.

The emission wavelength of the excitation light source applicable to EDFA theoretically includes three types, 800 nm, 980 nm, and 1480 nm. Excitation at 980 nm, among those, has been known as most desirable in terms of characteristics of amplifiers in consideration of gain, noise figure, and the like. The laser having such an emission wavelength of 980 nm is expected to meet contradicting demands as having a high output as the excitation light source and having a long lifetime. With respect to a wavelength around that wavelength, e.g., 890 nm to 1150 nm, while such a laser is demanded for SHG (secondary harmonic generation) light sources and heat sources for laser printers, other applications as well, developments of lasers with high output and high reliability have been expected.

In the field of information processing, semiconductor lasers are made with higher output and shorter wavelength for high density recording and high speed writing and reading. A higher output is strongly expected for conventional laser diodes (hereinafter referred to as "LD's") having emission wavelength of 780 nm, and the LD's having a 630 to 680 nm band have been energetically developed in various quarters.

As semiconductor lasers of about 980 nm, a semiconductor laser durable for continuous use for approximately two years with an optical output around 50 to 100 mW already has been developed. However, in operation under a higher optical output, rapid degradation occurs, and such a laser cannot have adequate reliability. This is the same to the LD's having 780 nm band and 630 to 680 nm band, and guaranteeing reliability at high output is a major concern for all semiconductor lasers particularly using a GaAs substrate.

One of the reasons of the poor reliability is degradation at a light emission facet of laser beam subjecting to very high optical density. As well known even in GaAs/AlGaAs based semiconductor lasers, many surface states exist at and around the facet, and those serve as nonradiative recombination centers and absorb the laser beam, so that generally the temperature around the facet is made higher than that of the bulk of the laser device, and so that this increased temperature further narrows band gaps around the facet and makes the laser beam more readily absorbed, as explained as occurrence of a positive feedback. This phenomenon is known as a facet degradation or namely COD (Catastrophic Optical Damage) observed when a large current flows at a moment, and sudden failure in devices according to a lowered COD level where a term aging test is made are common problems in many semiconductor laser devices.

Various proposals have been made to solve those problems. For example, various proposes had been made so far to make transparent the band gap at the active layer region around the facet with respect to the emission wavelength to suppress optical absorption around the facet. Lasers having such a structure are generally called window structure lasers or NAM (Non Absorbing Mirror) structure lasers, and these lasers are very effective where a high output is required. In a method to epitaxially grow a semiconductor material transparent to the emission wavelength on the laser facet, however, a subsequent electrode step becomes very complicated because the epitaxial growth is made where the laser is in a so-called bar state.

Meanwhile, various methods to make the active layer disordered by intentionally doing thermal diffusion or ion implantation of Zn, Si and so on as impurities doped into the active layer around the facet of the laser have been proposed (Japanese Unexamined Patent Publication Heisei No. 2-45,992, Japanese Unexamined Patent Publication Heisei No. 3-101,183, Japanese Unexamined Patent Publication Heisei No. 6-302,906). However, the impurities generally diffuse in the LD fabrication process from the epitaxial direction of the laser device to the substrate direction, so that a stable fabrication is difficult because the diffusion depth and lateral diffusion with respect to the direction of the cavity are not easily controlled. In cases of ion implantations, since high energy ions are introduced from facets, damages tend to remain at the LD facets even where anneal processing is made. Moreover, there arises another problem that an increased reactive current accompanying with decreased resistance in the impurity introduced region increases the threshold current and operation current of the laser.

On the other hand, Japanese Unexamined Patent Publication Heisei No. 3-101,183 discloses a method for forming a contamination-free facet and then forming a passivation layer or a part of this layer with the use of an oxygen excluding material undergoing neither any reaction with the semiconductor facet or diffusion by itself.

Generally, operation in air, e.g., in a clean room, cannot prevent nonradiative recombination centers, such as Ga—O, As—O, generated at the facet during cleaving, from forming. Accordingly, to form the contamination-free facet as described in this Journal, it is necessary to form a passivation layer at the same time as cleavage, but this can be carried out only in vacuum. Cleavage in vacuum requires extremely complicated apparatuses and operations in comparison with an ordinary cleavage done in air. Although this journal describes a method in which a facet is made by a dry etching, such a dry etching is not suitable for a fabrication method of LD requiring a longer lifetime because more nonradiative recombination centers are created in comparison with the facet formed by cleavage.

As similar to this journal, in L. W. Tu et al., "In-Vacuum cleaving and coating of semiconductor laser facets using silicon" and a dielectric, J. Appl. Phys. 80(11) Dec. 1, 1996, described is that where a Si/AlO$_x$ structure is cleaved in vacuum in the step of coating onto a laser facet, the carrier recombination speed is retarded, and thus the initial COD level is increased. This article, however, refers to neither reliability over a long time nor the relationship between the coating and the LD structure.

Further, there has been known a technique for inserting an Si layer having an optical thickness corresponding to ¼ of the emission wavelength at the boundary between the coating film and the semiconductor material as to displace the facet from the anti-node of the standing wave existing in the direction of the cavity, thus lowering the electric field strength at the beam emission facet. However, in a wavelength band that general semiconductor lasers are realized, particularly, 400 to 1600 nm, expected to be high output LD, Si by itself acts as an optical absorber, and thus, the device degradation may be accelerated due to increased temperature at the facet.

Thus, any semiconductor light emitting device and any fabrication method for semiconductor light emitting device, proposed previously, were not satisfactory from a technological viewpoint.

This invention has an object to solve the above problems in the prior art.

More specifically, it is an object of the invention to provide a high performance semiconductor light emitting device capable of stably suppressing the surface state density otherwise externally sensitive on a facet for a long time and establishing both of a high output and a long lifetime. It is another object of the invention to provide a semiconductor light emitting device capable of suppressing degradation at the facets and being manufactured in a simpler method allowing cleavage in air.

SUMMARY OF THE INVENTION

The inventors have discovered, as results of diligent researches to accomplish the above objects, an oxidizing state of a portion adjacent to a facet of a compound semiconductor layer or a facet of a passivation layer affects a long term stability of a surface state density at the facet and completed this invention.

That is, this invention is to provide a compound semiconductor light emitting device comprising: a substrate; a compound semiconductor layer containing a first conductive type clad layer, an active layer, and a second conductive type clad layer, the compound semiconductor layer being formed on the substrate; and a cavity structure formed of two opposing facets of the compound semiconductor layer, wherein surfaces of the first conductive type clad layer, the active layer, and the second conductive type clad layer forming the facet of the compound semiconductor are covered with a passivation layer, wherein at least one element constituting the facet of the compound semiconductor layer is not coupled to oxygen, and wherein a portion of the passivation layer adjacent to the facet of the compound semiconductor layer contains oxygen as a structural element.

In the compound semiconductor light emitting device according to the invention, the passivation layer preferably has a portion excluding any oxygen as a structural element, and may exclude any element belonging to 3 through 5 groups. The passivation layer preferably includes one or more elements selected from a group of Si, Ge, S, Se, and Al, particularly, Si.

According to an embodiment, with respect to a passivation layer, exemplified are a structure that portion, in the passivation layer, adjacent to a facet of the compound semiconductor layer is made of SiOx, and the other portion, in the passivation layer, is made of Si, or a structure that a portion, in the passivation layer, adjacent to a facet of the compound semiconductor layer is made of SiOx, and an intermediate portion, in the passivation layer, is made of Si, and a portion, in the passivation layer, adjacent to a coating layer is made of SiOx, or a structure that a portion, in the passivation layer, adjacent to a facet of the compound semiconductor layer is made of SiOx, and an intermediate portion, in the passivation layer, is made of Si, and a portion, in the passivation layer, adjacent to a coating layer is made of SiNx.

The passivation layer preferably has a thickness Tp (nm) satisfying the following formula (I):

$$0.2 \text{ (nm)} < Tp \text{ (nm)} < \lambda/8n \text{ (nm)} \qquad (I)$$

where $\lambda$ denotes an emission wavelength (nm) of the compound semiconductor light emitting device, and n denotes the real part of an average refractive index of the whole passivation layer at the wavelength $\lambda$.

In the compound semiconductor light emitting device according to the invention, the surface of the passivation layer is preferably covered with coating layers made of dielectric or a combination of dielectric and semiconductor. The coating layers preferably include one or more compounds selected from a group of AlOx, TiOx, SiOx, SiN, Si, and ZnS, and are constituted by a coating layer of a low reflectance including at one end, e.g., AlOx, and coating layers of a high reflectance at the other end including, e.g., AlOx and Si. A portion of the passivation layer adjacent to the coating layers may preferably include oxygen as a structural element.

The facets of the compound semiconductor layer are preferably (110) plane and or crystallographically equivalent planes, and preferably, exposed to plasma irradiation before formation of the passivation layer. The surface of the passivation layer may also preferably be exposed to plasma irradiation before formation of the coating layers. Such plasma irradiation desirably includes ion irradiation at energy between 25 eV and 300 eV.

An active layer preferably includes In as a structural element such as In$_x$Ga$_{1-x}$As (0<x≦1) or (Al$_x$Ga$_{1-x}$)$_y$In$_{1-y}$P (0≦x≦1, 0≦y<1) or the like, and desirably has a quantum well structure.

Moreover, an absolute value of enthalpy of formation of an oxide of an element constituting the passivation layer is desirably greater than an absolute value of enthalpy of formation of an oxide of at least one element constituting a facet of the compound semiconductor layer.

Oxygen contained as a structural element in the passivation layer is the oxygen coupled to the element constituting the facet of the compound semiconductor layer before formation of the passivation layer and preferably the oxygen immigrated to the passivation layer from the facet of the compound semiconductor layer by plasma irradiation or heat irradiation made to the passivation layer. Oxygen contained as a structural element in the passivation layer is preferably the oxygen immigrated to the passivation layer from the. facet of the compound semiconductor layer during plasma irradiation made at times of formation of the coating layers.

Figure 1:
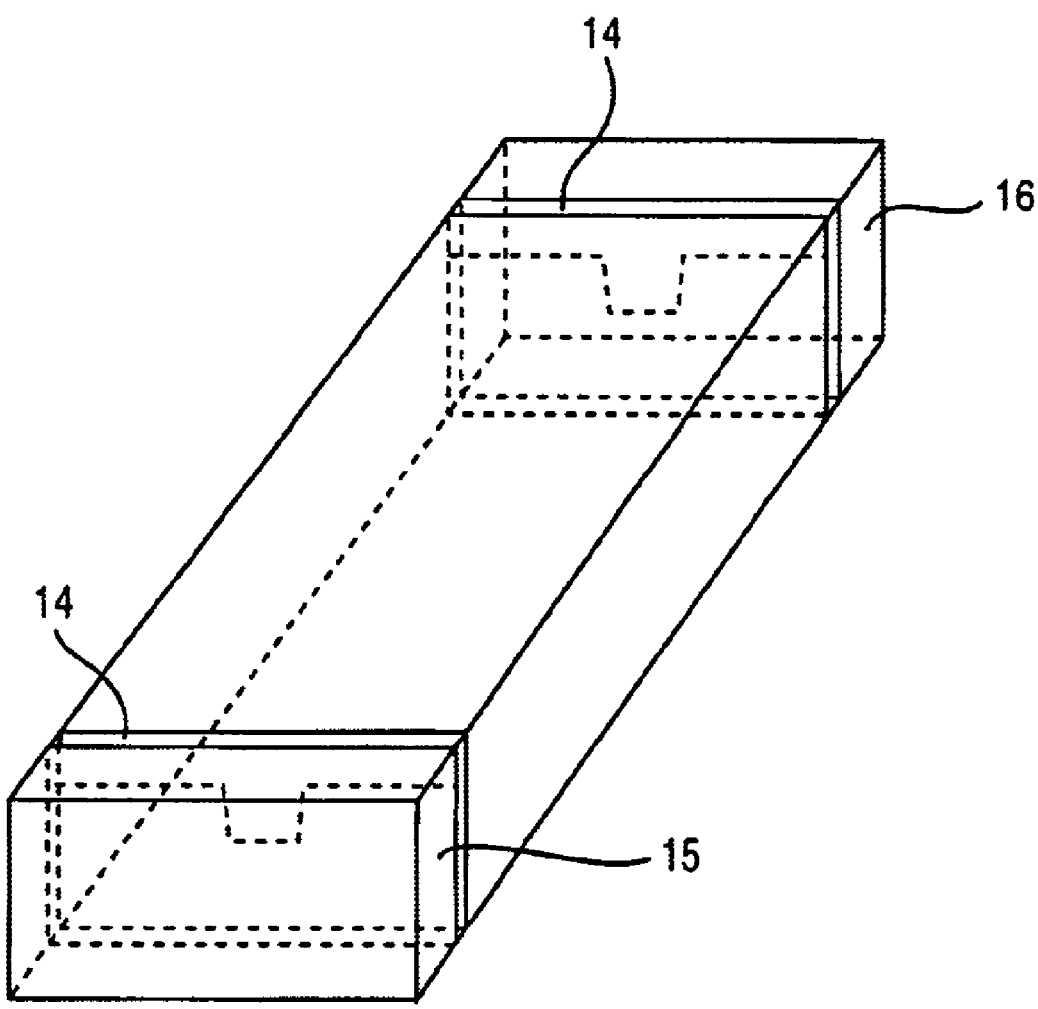
FIG. 1 is a perspective view showing an embodiment of a compound semiconductor light emitting device according to the invention.

In the drawings, numeral 1 represents a substrate; numeral 2 represents a buffer layer; numeral 3 represents a first conductive type clad layer; numeral 4 represents an active layer; numeral 5 represents a second conductive type first clad layer; numeral 6 represents a second etching stop layer; numeral 7 represents a first etching stop layer; numeral 8 represents a second conductive type second clad layer; numeral 9 represents a current block layer; numeral 10 represents a cap layer; numeral 11 represents a contact layer; numeral 12 represents an electrode; numeral 13 represents an electrode; numeral 14 represents a passivation layer; numerals 15, 16 represent coating layers.

DETAILED DESCRIPTION OF THE PREFERRED EMBODIMENTS

Hereinafter, the compound semiconductor light emitting devices according to the invention is described in details. The compound semiconductor light emitting device according to the invention has a compound semiconductor layer containing a first conductive type clad layer, an active layer, and a second conductive type clad layer formed on a substrate, and a cavity structure is formed of two opposing facets of the compound semiconductor layer. The compound semiconductor light emitting device according to the invention has features that surfaces of the first conductive type clad layer, the active layer, and the second conductive type clad layer forming the facet of the compound semiconductor are covered with a passivation layer, that at least one element constituting the facet of the compound semiconductor layer is not coupled to oxygen, and that a portion of the passivation layer adjacent to the facet of the compound semiconductor layer contains oxygen as a structural element.

The structure of the invented compound semiconductor light emitting device is not specifically limited as far as the above conditions are satisfied. Accordingly, some layers other than the first conductive type clad layer, the active layer, and the second conductive type clad layer can be placed. The fabrication method for the invented compound semiconductor light emitting device is not specifically limited either. As a typical fabrication method, a method in which a semiconductor wafer is produced by forming respective layers on a substrate, in which cavity facets are formed on the produced semiconductor wafer, and in which the facets are covered with a passivation layer, can be exemplified.

Figure 2:
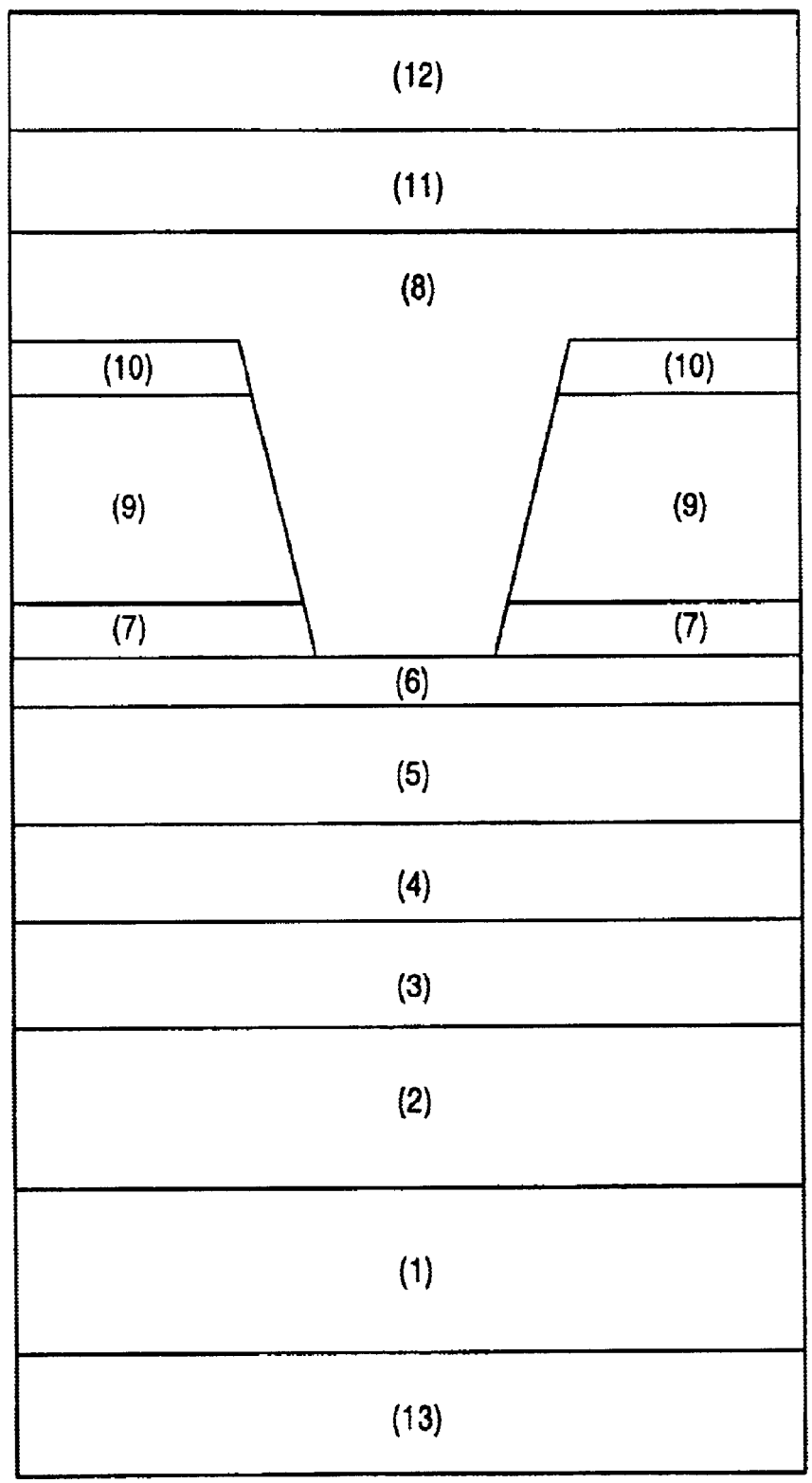
FIG. 2 is a cross-sectional view showing the embodiment of a compound semiconductor light emitting device according to the invention.

Hereinafter, a preferred structural example of the invented compound semiconductor light emitting device and a fabrication method for the invented compound semiconductor light emitting device are described in detail. The semiconductor wafer used for fabrication of the compound semiconductor light emitting device according to the invention has an index guided structure and a structure that the second conductive type clad layer is divided into two layers, that a current injection region is formed by the second conductive type second clad layer and a current block layer, that a contact layer is formed to reduce the contact resistance to an electrode (FIG. 2). Fabrication methods for the basic epitaxial structures of various lasers, e.g., the above example as a typical device, can be exemplified by one described in Japanese Unexamined Patent Publication Heisei No. 8-130, 344 (Horie et al). These lasers are used as light sources in optical fiber amplifiers for optical communications, light sources for pick-up in large-capacity magneto-optical memory for data processing. Furthermore, these lasers are applicable to various uses by varying the layer structure, or materials to be used.

FIG. 2 is schematic view of a structure of a groove type semiconductor laser as an example of the epitaxial structure in the present invention.

As a substrate (1), in consideration of the desired emission wavelength, lattice matching, strain intentionally introduced into the active layer, strain compensation in the active layer used for guide layers or the like, etc. single crystal substrates of InP, GaAs, GaN, InGaAs, $Al_2O_3$ and the like can be used. Some dielectric substrates such as those made of $Al_2O_3$ are also available in some cases. In the embodiment of the present invention, it is preferable to use an InP substrate or a GaAs substrate from the viewpoint of the lattice matching with III–V group compound semiconductor light emitting devices containing As, P, and the like. When as is contained as an element of the V group, it is most desirable to use a GaAs substrate. It is to be noted that in this specification the description of the group of the element is followed in a way of the IUPAC when it is described by Arabic numbers and followed in a way of a customary description when it is described by Roman numbers.

Dielectric substrates such as those made of $Al_2O_3$ may be used for materials containing nitrogen as an element of the V group in III–V group semiconductor light emitting devices.

As a substrate, not only so-called just substrates but also so-called off-angle substrates (miss oriented substrates) can be used from a viewpoint of improvement of the crystallinity in the epitaxial growth. Because of an effect promoting high quality crystal growth in the so-called step flow mode, these off-angle substrates are employed widely. Although off-angle substrates are usually inclined by 0.5 to 2 degrees, those inclined around 10 degrees may be used in some material systems constituting a quantum well structure.

The substrates may be subjected to, e.g., chemical etching, heat treatment, and the like in advance for the production of light emitting devices with the use of the crystal growth techniques such as MBE (Molecular Beam Epitaxy) or MOCDV (Metal Organic Chemical Vapor Deposition).

It is preferable to provide a buffer layer (2) to suppress the imperfectness in the substrate bulk crystals and facilitate the formation of epitaxial layers having the same crystal axis. It is preferable that the buffer layer (2) and the substrate (1) are made of the same compounds. When a GaAs substrate is used, for example, then GaAs is normally employed as the buffer layer. However, it also has been a practice to use a superlattice layer as the buffer layer. Namely, the buffer layer may be made of a different compound from the one of the substrate. When a dielectric substrate is used, on the other hand, it is not always needed that the buffer layer is made of the same compound, and a material different from the substrate can be appropriately selected as the buffer layer depending on the desired light emission wavelength and the whole structure of the device.

The first conductive type clad layer (3) is usually made of a material having a lower refractive index than the average refractive index of the active layer (4). This material is appropriately specified depending on the substrate (1), buffer layer (2), active layer (4), etc. prepared for establishing the desired emission wavelength. When GaAs is employed as both of the substrate and buffer layer (2), then AlGaAs based, InGaAs based, AlGaInP based, or InGaP based materials can be used for the first conductive type clad layer. In some case, the whole clad layer can be of a superlattice structure.

The advantages of the invention can be recognized notwithstanding the conductive type, the material, the structure, and the like of the active layer (4), but from the viewpoint of selecting the material, it is preferable that the active layer (4) is made of a material containing In and/or Ga, particularly, containing In. The most preferable material contains In and Ga. This is because the laser devices of the wavelength band realized by those materials when used for various applications are with great possibility demanded to have contradicting features of long lifetime and high output, both.

From these viewpoints, as a material for the active layer (4), it is preferable to use AlGaAs based materials, InGaAs based materials, InGaP based materials, AlGaInP based materials, and the like. More specifically, $In_x Ga_{1-x}As$ ($0<x \leq 1$) or $(Al_xGa_{1-x})_yIn_{1-y}P$ ($0 \leq x \leq 1$, $0 \leq y < 1$) is preferred. To realize a high output laser, it is preferable to have a quantum well structure. It is general that selection of those materials are determined depending on the desired emission wavelength.

Although the active layer (4) can be a usual bulk active layer consisting of a single layer, quantum well structures such as single quantum well (SQW) structure, double quantum well (DQW) structure, multiple quantum well (MQW) structure, and the like can be employed depending on the purpose. The active layer of the quantum well structure is usually employed together with an optical guide layer. To separate the quantum well, a barrier layer may be employed together, if needed. As the structure of the active layer, the separated confinement heterostructure (SCH) wherein optical guide layers are provided in both sides of the quantum well, graded index-guided SCH (GRIN-SCH) wherein the refractive index is continuously changed by gradually varying the composition of the optical guide layer, and the like can be used. A strained quantum well structure may be used to improve the laser property. It is also possible to select materials for the optical guide layers, to compensate the introduced strains in the whole active layers with employing opposite strains to the layers. The materials or the like of the optical guide layer may be selected to have strains reverse to the strains possessed by the quantum well layer to cancel strains as the active layer as a whole. The material of the optical guide layer may be appropriately selected from AlGaAs based material, InGaAs based material, InGaP based material, AlGaInP based material, AlInGaAs based material, InGaAsP based material, GaAsP based material, and the like as to meet with the active layer.

The optical guide layer can be a superlattice made in combination of the above materials. Moreover, the temperature characteristics can be improved by intentionally inserting a material having a large band gap between the quantum well and the optical guide layer.

Similarly to the first conductive type clad layer (3), the second conductive type first and second clad layers (5), (8) are made of a material having a lower refractive index than the average refractive index of the active layer (4). This material is appropriately specified depending on the substrate (1), the buffer layer (2), the active layer (4), and the like. When GaAs is employed as both of the substrate (1) and buffer layer (2), AlGaAs based material, InGaAs based material, InGaP based material, AlGaInP based material, AlInGaAs based material, InGaAsP based material, GaAsP based material, and the like can be used.

FIG. 2 shows two types of etching stop layers (6), (7) and a cap layer (10). These layers, which are employed in a preferable embodiment of the present invention, are effective in precisely and easily forming the current injection region.

When the second etching stop layer (6) is made of, for example, an $Al_aGa_{1-a}As$ ($0 \leq a \leq 1$) material, GaAs is preferably used ordinarily. This is because the second conductive type second clad layer (8) and the like can be grown with a good crystallinity particularly with the regrowth with the AlGaAs based material. It is usually preferable that the second etching stop layer (6) is 2 nm or thicker in thickness.

As the first etching stop layers (7), it is appropriate to use a layer represented by $In_bGa_{1-b}P$ ($0 \leq b \leq 1$). When GaAs is employed as the substrate, b=0.5 is employed usually in a lattice-matched system. The first etching stop layer (7) is usually 5 nm or more, preferably 10 nm or more in thickness. When its thickness is less than 5 nm, etching may not be stopped due to undulation of the thickness or the like. On the other hand, a strain system can be used depending on the layer thickness and, in such a case, a composition of, e.g., b=0, or b=1 can be used.

A cap layer (10) is used as a protection layer for the current block layer (9) in the first growth and at the same time, to facilitate the growth of the second conductive type second clad layer (8). Before the device structure is completed, the cap layer is partly or completely removed.

The current block layer (9) is required to literally block currents and not to flow any current substantially. Therefore, it is preferable that the layer has the same conductive type of the first conductive type clad layer (3) or undoped. For example, it is preferable that where a current block layer (9) is made of an AlGaAs based material the current block layer preferably has a refractive index lower than that of the second conductive type second clad layer (8) made of $Al_yGa_{1-y}As$ ($0<y \leq 1$). That is, where the current block layer is made of $Al_zGa_{1-z}As$ ($0<z \leq 1$), therefore, it is preferable that z is larger than y as the Al concentration.

The second conductive type second clad layer (8) usually has a refractive index equal to or lower than that of the active layer (4). The second conductive type second clad layer (8) is usually the same as the first conductive type clad layer (3) and the second conductive type first clad layer (5). In a preferred embodiment of the present invention, the second conductive type first clad layer (5), the second conductive type second clad layer (8), and the current block layer (9) can be all made of the same material basis of the same composition. In such a case, an effective refractive index difference is formed by the first etching stop layer (7). When the cap layer (10) is not completely eliminated, an effective refractive index difference is formed by the cap layer (10), in addition to the one formed by the first etching stop layer (7). This layered structure is highly preferable, since the structure solves various problems caused by the differences in the materials or compositions at each interface between the second conductive type second clad layer (8) and the current block layer (9).

It is preferable to provide a contact layer (11) on the second conductive type second clad layer (8) so as to lower the contact resistance with the electrode (12). This contact layer (11) is usually made of a GaAs material. To lower the contact resistance with the electrode (12), the carrier concentration in this layer is normally set higher than other layers.

In usual, the thickness of the buffer layer (2) ranges from 0.1 to 3 $\mu$m; that of the first conductive type clad layer (3) ranges from 0.5 to 3 $\mu$m; that of the active layer (4) ranges from 0.0005 to 0.02 $\mu$m per layer in the case of the quantum well structure; that of the second conductive type first clad layer (5) ranges from 0.05 to 0.3 $\mu$m; that of the second conductive type second clad layer (8) ranges from 0.5 to 3 $\mu$m; that of the cap layer (10) ranges from 0.05 to 0.5 $\mu$m; and that of the current block layer (9) ranges from 0.3 to 2 $\mu$m.

The semiconductor light emitting device as shown in FIG. 2 is further provided with electrodes (12), (13). In the case of a p-type, the electrode (12) is formed by an evaporation on the surface of the contact layer (11), for example, Ti/Pt/Au successively and then alloying them. On the other hand, the electrode (13) is formed on the surface of the substrate (1). In the case of the n-type electrode, the substrate (1) is successively deposited with AuGe/Ni/Au followed by alloying.

The preferred structural examples and fabrication examples of the semiconductor wafer are described above, but according to the invention, other semiconductor wafers having a structure other than the above can be fabricated.

The processed semiconductor wafer is formed with cavity facets. The cavity facet can be prepared by an ordinarily used method in the fabrication process for semiconductor light emitting devices, and there is no special limitation to the method.

It is referable to use a method to make the wafer in a state of a so-called laser bar by forming facets by cleavage. Cleavage is widely used in the case of an edge-emission type laser, and the facets formed by cleavage are different according to the orientation of the substrate to be used. For example, where a device such as an edge-emission type laser is formed by using a substrate having a plane crystallographically equivalent to nominally (100) plane employed preferably, (110) plane or a plane crystallographically equivalent thereto serves as each of the plane for forming a cavity. In a meanwhile, when the off-angle substrate is employed, the facets do not always meet at right angles with the direction of the cavity according to the relation between the inclination direction and the direction of the cavity. For example, when a substrate with two-degree inclination toward the direction (1-10) from the substrate (100) is employed, each of the facets is also inclined by two degrees. The cavity may be created during crystal growth likewise in the case of vertical cavity surface emitting lasers.

In the present invention, troublesome cleavage step in vacuum is not always needed. Cleavage can be done under atmospheric pressure or in a nitrogen atmosphere. This is because the process such as plasma irradiation or the like done after cleavage can stably, reproducibly suppress the surface state densities occurring on extrinsic causes. Therefore, the compound semiconductor light emitting device according to the invention can be manufactured in a simpler method.

The plasma irradiation for stably, reproductively suppressing the surface state densities occurring on extrinsic causes is made to, at least, the first conductive type clad layer (3), the active layer (4), and the second conductive type clad layers (5), (8), which are exposed at the facet. The plasma can also be irradiated at that time to the substrate (1), the buffer layer (2), the first etching stop layer (7), the second etching stop layer (6), the current block layer (9), the cap layer (10), the contact layer (11), and the like which are exposed at the facet. Normally, plasma irradiation is preferably made to the entire facet or facets.

More specifically, a method for irradiating charged particles of a low energy around 25 to 300 eV, namely ions, electrons, and plasma as combination of those, preferably 18 groups or hydrogen plasma as a plasma source, can be exemplified. As 18 groups plasma sources, helium or argon plasma, krypton plasma, xenon plasma can be exemplified specifically. Radiation of those to the facets removes oxides having relatively large vapor pressure (e.g., As—O, etc.) such as the V group or VI group among oxides of elements constituting the facets. The plasma irradiation is made in vacuum such as $10^{-3}$ Torr or less, preferably $10^{-4}$ Torr or less, most preferably $10^{-5}$ Torr or less. As described below, plasma irradiation to the passivation layer formed on the facets is effective in contribution to suppress stably, reproducibly surface state densities occurring due to extrinsic causes.

As—O or Ga—O, particularly, As—O can be effectively removed by irradiating argon plasma or hydrogen plasma of low energies around 25 to 300 eV. Particularly, the irradiation of low energy argon plasma is remarkable. This method is superior, in comparison with ion implantations of impurities, because of very low processing energy as to make processing to the facets subjecting to lower damages.

It is desirable to maintain the facet temperature at a relatively high temperature and to thermally promote desorption of the oxides of elements forming the semiconductor facet. To do so, it is preferable to increase the temperature in use of a halogen lamp or the like in a short time to process the facet in a range not to assist diffusion of the impurities or the like in the bulk of the semiconductor light emitting device.

In the compound semiconductor light emitting device according to the invention, it is preferable, by utilizing above methods, that at least one element constituting the facet of the compound semiconductor layer is not coupled to oxygen and that a portion of the passivation layer adjacent to the facet of the compound semiconductor layer contains oxygen as a structural element.

As a method to confirm that at least one element constituting the semiconductor layer facet is not coupled to oxygen or a method to analyze in what state the passivation layer described below exists, an XPS (X-ray photo-electron spectroscopy) is exemplified. This method is very advantageous in analyzing the chemical binding of each element. The chemical binding of each element constituting a sample can be confirmed by exposing an X-ray condensed to a size of about 100 $\mu$m×100 $\mu$m to the sample and spectroscopically analyzing the energy of photoelectrons generated resultantly. By varying the angle of the photoelectron detector to the sample surface in this step, information on the surface or in the vicinities at a prescribed position can be easily obtained. As will be described hereinafter, lasers are generally coated with a dielectric material optionally combined with a semiconductor at the facets, and therefore, prior to the above-mentioned XPS analysis, it is a practice to reduce the thickness of the coating film so as to have an appropriate thickness for the analysis by various etching techniques. In the case of a laser formed with a thin coating film of about 2 to 5 nm, the facets of the semiconductor laser can be analyzed without going through the above etching procedure and the like.

The passivation layer is formed on the cavity facet thus formed. The phrase "passivation layer" means, in this specification, a layer formed on a facet of a compound semiconductor light emitting device for preventing chemical reactions with elements such as oxygen or the like which tend to form nonradiative recombination centers when coupled to elements constituting the facet. The passivation layer has a function, when oxygen or the like exists at the facet, to separate at least a part of the oxygen coupled to the elements constituting the semiconductor facet by oxidizing the passivation layer itself. In this specification, a layer that comes to contain some oxide in a part by oxidizing the layer itself is also referred to as a "passivation layer" collectively.

The passivation layer is formed as to cover at least a first conductive type clad layer, an active layer, and a second conductive type clad layer, which constitute the facet, but normally, formed as to cover the entire facet. The passivation layer in this invention is formed, after plasma is irradiated to the facets in vacuum, successively in vacuum, namely, in vacuum around $10^{-3}$ Torr or less, preferably around $10^{-6}$ Torr or less, most preferably, in high level vacuum of $10^{-7}$ Torr or less.

The passivation layer preferably contains an element having a greater absolute value of enthalpy (eV/metal atom) of formation of an oxide than an absolute value of enthalpy of formation of an oxide of at least one element constituting a semiconductor facet. Particularly, it is preferable that the passivation layer contains an element having a greater absolute value of enthalpy (eV/metal atom) of formation of an oxide than an absolute value of enthalpy of formation of an oxide of any element constituting a semiconductor facet.

As a semiconductor material, AlGaAs based material, InGaAs based material, InGaP based material, AlGaInP based material, AlInGaAs based material, InGaAsP based material, GaAsP based material, and the like are mainly used. As a semiconductor material, elements of the group 2 can be used. As elements constituting those semiconductor materials, for example, the enthalpy of formation of $Ga_2O_3$ is −5.64 eV/metal atom, and the enthalpy of formation of $In_2O_3$ is −4.80 eV/metal atom. The enthalpy of formation of MgO is −6.24 eV/metal atom.

On the contrary, the element suitably used for the passivation layer in this invention has a great absolute value of enthalpy of formation of an oxide. In this invention, the passivation layer preferably includes one or more elements selected from a group of Si, Ge, S, Se, and Al, and more preferably includes Si. The enthalpy of formation of $SiO_2$ is −9.44 eV/metal atom, and it is the absolute value greater than an absolute value of enthalpy of formation of an oxide of any element constituting a semiconductor facet. Therefore, the passivation layer containing these elements is useful to various semiconductor materials. Particularly, such a passivation layer is very effective and useful for semiconductor materials excluding Al.

The crystallographic structure and features of elements attached as the passivation layer (14) to the semiconductor facet may vary depending on the fabrication method, but any of single crystal, polycrystal, and amorphous can be found advantageous. Particularly, the layer formed at a low deposition rate in a high level vacuum is effective and very preferable.

Although the band edge of Si generally varies depending on the film properties, it is deemed as transparent to light of emission wavelength of about 2 $\mu$m or longer and as no absorption. To the contrary, Si shows a refractive index (n+ik) to rays of emission wavelength of about 2 $\mu$m or shorter, wherein n means the real part of the refractive index, k is an extinction coefficient and n is about 3.5.

It is generally preferable that the thickness Tp (nm) of the passivation layer (14) is thicker than 0.2 nm. However, an extremely thick passivation layer (14) of, for example, 100 nm is not suitable in some cases. The lower limit of the preferable thickness of the passivation layer (14) is specified by the factors for the existence of the passivation layer by itself as a film, while the upper limit thereof is determined from the balance to the effects of light absorption where light emitted from the active layer is absorbed by a part of the passivation layer. Where the passivation layer is deposited on the facet, namely, consideration should be made on the factor of coating the whole facets with the passivation layer and the effect of an increase in the temperature at the facets due to the absorption of emitted light. Where plasma irradiation is made over the passivation layer, the passivation layer must be so thin as to reach at the facet the energy adequately inducing reducing reactions at the semiconductor facets. A preferable thickness range of the passivation layer is confirmed as represented by the following formula:

$$0.2 \text{ (nm)} < Tp \text{ (nm)} < \lambda/8n \text{ (nm)} \tag{I}$$

where n means the real part of the average refractive index of the entire passivation layer at emission wavelength $\lambda$. However, the above formula is no more than a desirable range, and the improved advantages are confirmed when the passivation layer has a thickness equal to and less than 0.2 nm.

Oxidizing reaction is promoted at a portion of the passivation layer by oxygen derived from the semiconductor facet by plasma irradiation or heat irradiation for separating oxygen remaining on the facet or plasma irradiation implemented together when a coating material is supplied after formation of the passivation layer. It is preferable at that time for the passivation layer to have a thickness such that all the structural elements of the passivation layer are not oxidized. This is because if all the passivation layer is oxidized, the oxygen taken temporarily in the passivation layer may cause oxidation of the facet again during laser operation for a long time. Moreover, it is preferred that all the elements constituting the semiconductor facet have no coupling to oxygen, but if all the passivation layer is oxidized, such a coupling of the elements constituting the semiconductor facet to oxygen may not be eliminated completely. Those situations are not favorable because those situations would reduce advantages in improved lifetime.

In this invention, it is preferable to form coating layers (15), (16) made of a dielectric material or a combination of a dielectric material and a semiconductor on the passivation layer (14) formed on the exposed semiconductor facets (see, FIG. 1). Particularly, plasma irradiation to the facets and formations of the passivation layer (14) and the coating layers (15), (16) are preferably performed successively under a negative pressure, more preferably, in vacuum. The coating layers are formed mainly for two purposes, to raise an emission efficiency from the semiconductor laser, and to further protect the facets. To achieve a high output, it is a general practice to form an asymmetric coating in which a coating layer having a low reflectance with respect to the emission wavelength on the front facet and coating layers having a high reflectance with respect to the emission wavelength on the rear facet.

Various materials are applicable to the coating layers (15), (16). For example, it is preferable to use one compound or a combination of two or more compounds selected from a group consisting of AlOx, TiOx, SiOx, SiN, Si and ZnS.

As the coating layer having a low reflectance, use is made of AlOx, TiOx, SiOx, and the like, while the coating layers having a high reflectance are made of an AlOx/Si multilayered film, a TiOx/SiOx multilayered film, and the like. The thickness of each layer is controlled so as to give the desired reflectance. It is general to control the thickness of AlOx, TiOx, SiOx, and the like for constituting the coating layer having a low reflectance to be around $\lambda/4n$ where while n denotes the real part of the refractive index at the emission wavelength $\lambda$. Also, for the coating layer having a high reflectance, it is general to adjust the respective materials constituting the layers to be around $\lambda/4n$.

To form the coating layers (15), (16), it is adequate to use the so-called ion assisted deposition (IAD) method. This method is to irradiate plasma (particularly ions, inter alia) having a certain energy at the same time as evaporation of coating materials, and it is particularly preferable to irradiate plasma of a rare gas. The IAD method with Ar ions, among rare gases, has remarkable effects in improving the film properties of the coating materials. It is still preferable to set the irradiation energy of Ar ions within a low energy range preferably from 25 to 300 eV, more preferably 50 to 200 eV. Thus coating can be completed without damaging the semiconductor facets.

What is to be concerned here is that the plasma energy simultaneously irradiated at the formation of the coating films promotes the reactions described below, thereby making at least a part of the remaining oxides at the semiconductor facets changed as not to be in a form of an oxide where such oxides are remaining at the semiconductor facet. That is, the plasma irradiation promotes reactions that the structural elements existing in the passivation layer, particularly adjacent to the semiconductor facets, come to couple with oxygen remaining at the semiconductor facets. Consequently, it is possible to reduce the couplings between the elements constituting the semiconductor facets and oxygen down to a very low level or eliminate the couplings completely. This plasma irradiation is therefore an effective means to suppress the surface state densities as described above occurring due to extrinsic causes. It is to be noted that it is most preferable that the plasma irradiation is made simultaneously at the formation of the coating films, but it can be made before or after the formation of the coating films.

To facilitate such reactions, an absolute value of enthalpy of formation between at least one element constituting the passivation layer and oxygen must be greater than an absolute value of enthalpy of formation between at least one element constituting a facet of the compound semiconductor layer and oxygen. The energies of supplied plasma or heats or the like are also required having an adequate amount to induce these reactions. Those energies are desirably selected within a range not to give excessive damages to the semiconductor facets.

For example, where a passivation layer including Si is formed while Ga—O is remaining at the semiconductor facets, and where argon plasma is irradiated while sources of AlOx is fed, Si of the passivation layer facing the semiconductor facets comes to partly have a form of SiOx as a result of promoted couplings to oxygen derived from Ga—O. Therefore, the gallium constituting a part of the semiconductor facets is not in a form of the oxide, but in coupling to metal gallium or other elements constituting the semiconductor facets, forms, e.g., Ga—As. Consequently, the nonradiative recombination centers existing at the semiconductor facets derived from the Ga—O couplings are largely reduced, and therefore, the method can contribute to provide a desirable semiconductor light emitting devices having a high output and a long lifetime.

Although the above reaction has the greatest advantages in the IAD method in which sources is fed at the same time, similar advantages can be obtained where ion irradiation is solely made to the passivation layer after the formation of the passivation layer, where heat irradiation is made after the formation of the passivation layer, and where heat irradiation is made at the same time as the plasma radiaition.

When the above reactions are induced particularly by the IAD method, another reaction may occur on a side of the coating film of the passivation layer as separately from the reactions on the semiconductor facets by such as elements partly constituting the coating films or nitrogen plasma fed in a form of plasma during film formation. That is, where the coating film is an oxide, the passivation layer may be oxidized by the film. Where the coating film is a nitride, nitriding reactions may be promoted.

As a result of those reactions, the passivation layer may be formed with the oxide at a portion adjacent to the compound semiconductor layer facets, and other portions may remain the structural elements of the passivation layer formed initially. The passivation layer may have a portion adjacent to the facet of the compound semiconductor layer made of an oxide, and an intermediate portion made of the structural elements or compound, as it is, of the passivation layer formed initially, and a portion adjacent to the coating layer made of the oxide, the nitride, the sulfide, or the like. The thickness of each layer is depending on the thickness of the passivation layer formed initially. In an ordinal process, an oxide layer or nitride layer of about 1 to 10 Angstroms on the side of the semiconductor facet and on the side of the coating film is produced, and the passivation layer not modified of several to several tens Angstroms remains at the center.

To further illustrate the present invention in greater detail, the following Examples will be given. However, it is to be understood that as far as not deviated from the sprit of the present invention, materials, concentrations, thicknesses, order of manipulations can be modified in a proper way, and therefore, this invention is not limited to embodiments shown in the following Examples.

EXAMPLE 1

A laser device of the groove type shown in FIG. 2 was formed as following below procedures.

On a surface of (100) plane of an n-GaAs substrate (1) having a carrier concentration of $1 \times 10^{18}$ cm$^{-3}$ successively grown by the MBE method were, an n-GaAs layer having a thickness of 1 $\mu$m and a carrier concentration of $1 \times 10^{18}$ cm$^{-3}$ as a buffer layer (2); an n-Al$_{0.35}$Ga$_{0.65}$As layer having a thickness of 1.5 $\mu$m and a carrier concentration of $1 \times 10^{18}$ cm$^{-3}$ as a first conductive type clad layer (3); and furthermore, an active layer (4) consisting of an undoped In$_{0.16}$Ga$_{0.84}$As single quantum well (SQW) having a thickness of 6 nm on an undoped GaAs optical guide layer having a thickness of 30 nm, and over the SQW, an undoped GaAs optical guide layer having a thickness of 30 nm; a p-$Al_{0.35}Ga_{0.65}As$ layer having a thickness of 0.1 μm and a carrier concentration of $1\times10^{18}$ $cm^{-3}$ as a second conductive type first clad layer (5); a p-GaAs layer having a thickness of 10 nm and a carrier concentration of $1\times10^{18}$ $cm^{-3}$ as a second etching stop layer (6); an n-$In_{0.5}Ga_{0.5}P$ layer having a thickness of 20 nm and a carrier concentration of $5\times10^{17}$ $cm^{-3}$ as a first etching stop layer (7); an n-$Al_{0.39}Ga_{0.61}As$ layer having a thickness of 0.5 μm and a carrier concentration of $5\times10^{17}$ $cm^{-3}$ as a current block layer (9); and an n-GaAs layer having a thickness of 10 nm and a carrier concentration of $1\times10^{18}$ $cm^{-3}$ as a cap layer (10).

A silicon nitride mask was formed on regions except the current injection region of the topmost layer. The silicon nitride mask had an opening width of 1.5 μm. Etching was performed by using the first etching stop layer (7) as an etching stop layer at 25° C. for 30 seconds so as to eliminate the cap layer (10) and the current block layer (9) in the current injection region. This etching was carried out with the use of a mixture of sulfuric acid (98 wt %), hydrogen peroxide (30% aqueous solution) and water in a ratio of 1:1:5 by volume as an etching material or an etchant.

The silicon nitride layer was removed in dipping a mixing solution mixing HF (49%) and $NH_4F$ (40%) at a rate of 1:6 for 2 minutes and 30 seconds. Subsequently, the first etching stop layer in the current injection region was eliminated by etching at 25° C. for 2 minutes with the use of the second etching stop layer as an etching stop layer. This etchant was a mixture of hydrochloric acid (35 wt %) and water at a ratio of 2:1.

Subsequently, a p-$Al_{0.35}Ga_{0.65}As$ layer having a carrier concentration of $1\times10^{18}$ $cm^{-3}$ was grown as the second conductive type second clad layer (8) by MOCVD method to obtain a thickness of 1.5 μm in buried part (i.e., the current injection region). Finally, a p-GaAs layer having a thickness of 3.5 μm and a carrier concentration of $1\times10^{19}cm^{-3}$ was grown as a contact layer (11) to maintain good electrical contact with the electrode. The width W of the current injection region (the width of the second conductive type second clad layer at the interface with the second etching stop layer) was 2.2 μm. On the substrate side as an n-type electrode (13), AuGeNi/Au was evaporated, while Ti/Pt/Au was evaporated as a p-type electrode (12) followed by alloying at 400° C. for 5 minutes to thereby form a semiconductor wafer completely.

Next, in air, this wafer was cleaved into laser bars of 700 μm in cavity length to expose the (100) plane, and the laser bars were thereby put in a vacuum chamber equipped with a plasma generator. Then, in the vacuum chamber of $3\times10^{-5}$ Torr, Ar plasma was irradiated to the facet (cleaved surface) at 60 eV in average energy and 150 μA/$cm^2$ in current density for one minute. Successively, in vacuum at $2\times10^{-7}$ Torr or below, amorphous Si was deposited in a thickness of 2 nm on the facets by the ordinary electron beam evaporation method, thereby forming a silicon passivation layer (14). Then, an $AlO_x$ film of 165 nm in thickness was successively formed so as to make the reflectance of the front facet 2.5% at an emission wavelength of 980 nm, thereby forming a coating layer (15). In the $AlO_x$ film formation, which is so-called IAD method, Ar plasma having the average energy of 120 eV and a current density of 200 μA/$cm^2$ was applied in a vacuum of $4\times10^{-5}$Torr to the facet at the same time as feeding of sources of the $AlO_x$. It is confirmed that the real part of the refractive index of the amorphous Si at 980 nm was about 3.4.

Subsequently, the laser bars were once taken out from the vacuum chamber to be treated on a side of the rear facet.

Then the rear facet was treated in the same manner as those employed for the front facet, to perform Ar plasma irradiation and to form a silicon passivation layer (14), and successively, the coating layers (16) were formed so as to consist of four films, namely, $AlO_x$ layer having a thickness of 170 nm, an amorphous Si of 60 nm, $AlO_x$ of 170 nm, and an amorphous Si of 60 nm, thereby forming the rear facet with the reflectance of 92%. Also, the $AlO_x$ films were formed by the IAD method in the same manner as those employed for the front facet and the amorphous Si was formed by the electron beam evaporation method in the same manner as those employed for the front facet.

An XPS measurement was carried out to analyze the front facet of a single sample of an obtained compound semiconductor light emitting device. First, the thickness of the AlOx at the front facet is reduced to about 20 Angstroms by a wet etching, and then, the measurement was carried out. The state of the semiconductor laser facet was observed with a photoelectron detection angle of 75°. Neither Ga—O nor As—O is detected though ordinarily existing on (110) plane exposed to air one time.

In use of an angle resolved XPS method, the state of the amorphous Si was searched. As a result, although the film was produced in a good vacuum, it was confirmed that the amorphous Si had SiOx on the interface side to the semiconductor. This is that the oxygen of the oxide remaining at the facet of the compound semiconductor even after the initial plasma irradiation was coupled to Si formed in a film as the passivation layer by the energy of the plasma irradiation during the coating. It is to be noted that the enthalpy of formation of $Ga_2O_3$ is –5.64 eV/metal atom, and the enthalpy of formation of $SiO_2$ is –9.44 eV/metal atom.

From the angle resolved XPS method, it was confirmed that the boundary between the amorphous Si produced as the passivation layer and the AlOx coating layer was partly made into SiOx by oxygen from the AlOx. That is, the layer of the amorphous Si produced as the passivation layer was confirmed as having a structure of SiOx/Si/SiOx from the side of the semiconductor facet. The thicknesses of the respective layers were about 6 Angstroms/6 Angstroms/8 Angstroms.

Figure 3:
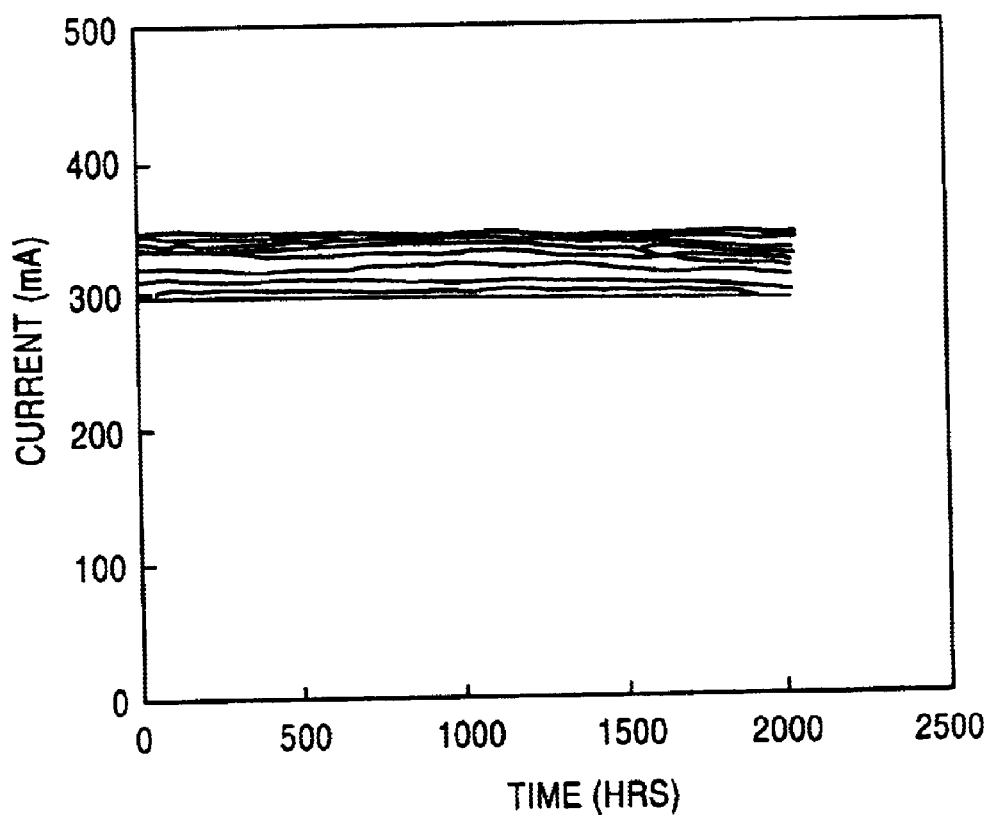
FIG. 3 is aging test results of the compound semiconductor light emitting device of Example 1.

Ten compound semiconductor light emitting devices thus produced were mounted on sub-mounts for heat radiation and placed in packages in a nitrogen atmosphere. As the average initial property of the compound semiconductor light emitting devices, the threshold current was 23 mA at 25° C., and kink was observed at 350 mA, 250 mW. To this group, aging test was carried out. As results of an accelerated test of 200 mW, 50° C., no sudden failures were observed even after passing 2,000 hours as shown in FIG. 3, and it was confirmed that the lasers operated stably.

EXAMPLE 2

Compound semiconductor light emitting devices were produced in substantially the same manner as Example 1 except some modified points that $H_2$ plasma of the average energy of 120 eV and a current density of 150 μA/$cm^2$ was irradiated for five minutes to the front and rear facets.

An XPS measurement was carried out to analyze the front facet of a single sample of an obtained compound semiconductor light emitting device. First, the thickness of the AlOx at the front facet is reduced to about 20 Angstroms by a wet etching, and then, the measurement was carried out. The state of the semiconductor laser facet was observed with a photoelectron detection angle of 75°. Neither Ga—O nor As—O is detected though ordinarily existing on (110) plane exposed to air one time.

In use of an angle resolved XPS method, the state of the amorphous Si was searched. As a result, although the film was produced in a good vacuum, it was confirmed that the amorphous Si had SiOx on the interface side to the semiconductor. This is that the oxygen of the oxide remaining at the facet of the compound semiconductor even after the initial plasma irradiation was coupled to Si formed in a film as the passivation layer by the energy of the plasma irradiation during the coating.

From the angle resolved XPS method, it was confirmed that the boundary between the amorphous Si produced as the passivation layer and the AlOx coating layer was partly made into SiOx by oxygen from the AlOx. That is, the layer of the amorphous Si produced as the passivation layer was confirmed as having a structure of SiOx/Si/SiOx from the side of the semiconductor facet. The thicknesses of the respective layers were about 5 Angstroms/8 Angstroms/7 Angstroms.

Figure 4:
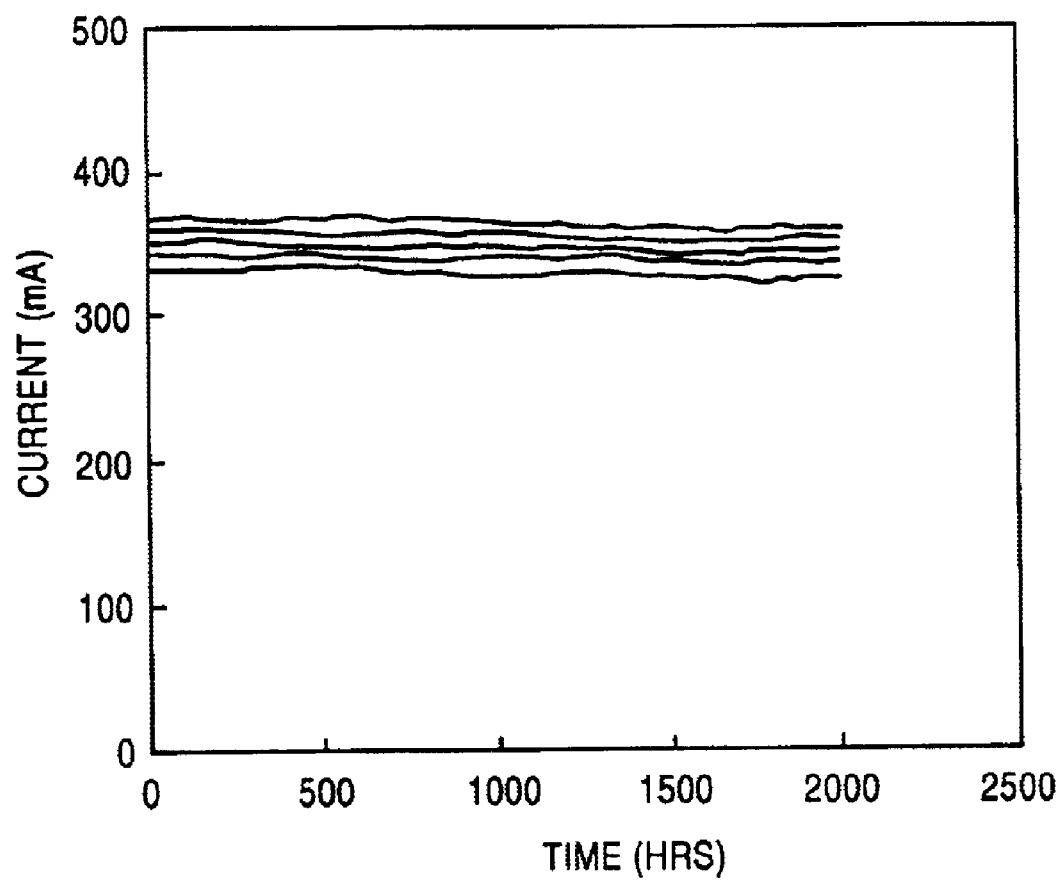
FIG. 4 is aging test results of the compound semiconductor light emitting device of Example 2.
Figure 5:
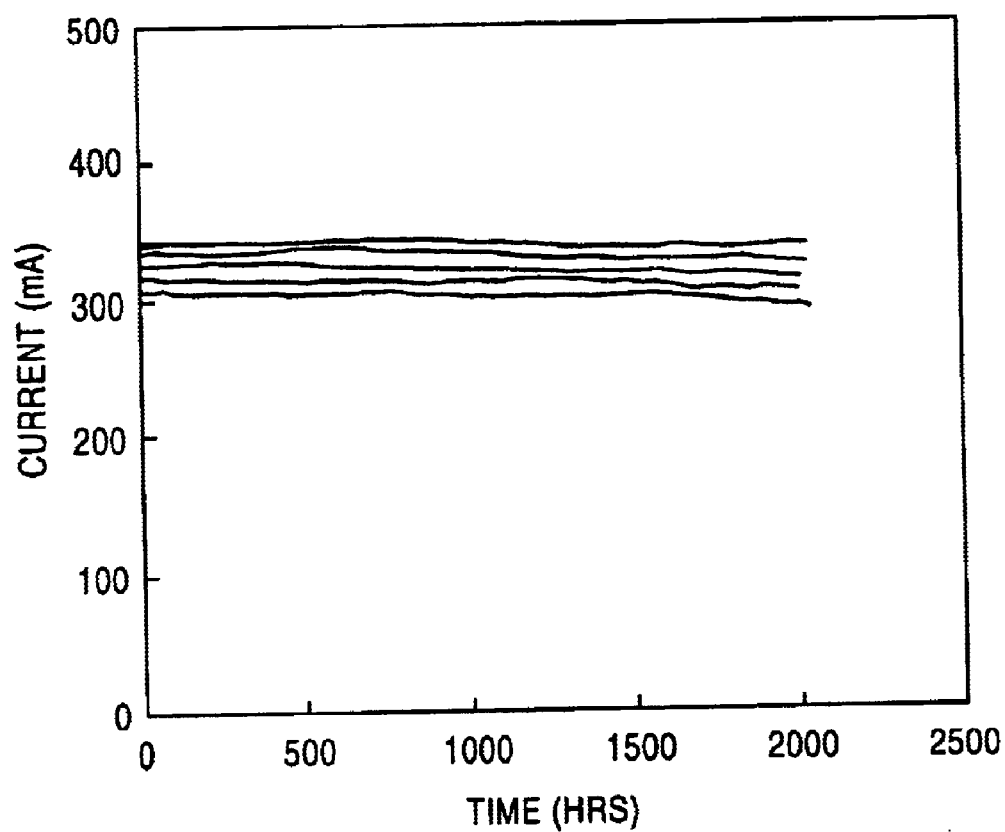
FIG. 5 is aging test results of the compound semiconductor light emitting device of Example 3.

Five compound semiconductor light emitting devices thus produced were mounted on sub-mounts for heat radiation and placed in packages in a nitrogen atmosphere. As the average initial property of the compound semiconductor light emitting devices, the threshold current was 23 mA at 25° C., and kink was observed at 350 mA, 250 mW. To this group, aging test was carried out. As results of an accelerated test of 200 mW, 50° C., no sudden failures were observed even after passing 2,000 hours as shown in FIG. 4, and it was confirmed that the lasers operated stably.

EXAMPLE 3

Compound semiconductor light emitting devices were produced in substantially the same manner as Example 1 except some modified points that after a passivation layer was formed on the front and rear facets, Ar plasma of the average energy of 110 eV and a current density of 200 $\mu A/cm^2$ was radiated for 30 seconds in vacuum of $4\times10^{-5}$ Torr to the passivation layer without feeding any source for the coating layer, and successively AlOx was formed by an ordinary electron beam evaporation.

An XPS measurement was carried out to analyze the front facet of a single sample of an obtained compound semiconductor light emitting device. First, the thickness of the AlOx at the front facet is reduced to about 20 Angstroms by a wet etching, and then, the measurement was carried out. The state of the semiconductor laser facet was observed with a photoelectron detection angle of 75°. Neither Ga—O nor As—O is detected though ordinarily existing on (110) plane exposed to air one time.

In use of an angle resolved XPS method, the state of the amorphous Si was searched. As a result, although the film was produced in a good vacuum, it was confirmed that the amorphous Si had SiOx on the interface side to the semiconductor. This is that the oxygen of the oxide remaining at the facet of the compound semiconductor even after the initial plasma irradiation was coupled to Si formed in a film as the passivation layer by the energy of the plasma irradiation during the coating.

From the angle resolved XPS method, it was confirmed that the boundary between the amorphous Si produced as the passivation layer and the AlOx coating layer was partly made into SiOx by oxygen from the AlOx. That is, the layer of the amorphous Si produced as the passivation layer was confirmed as having a structure of SiOx/Si/SiOx from the side of the semiconductor facet. The thicknesses of the respective layers were about 7 Angstroms/5 Angstroms/8 Angstroms.

Five compound semiconductor light emitting devices thus produced were mounted on sub-mounts for heat radiation and placed in packages in a nitrogen atmosphere. As the average initial property of the compound semiconductor light emitting devices, the threshold current was 23 mA at 25° C., and kink was observed at 350 mA, 250 mW. To this group, aging test was carried out. As results of an accelerated test of 200 mW, 50° C., no sudden failures were observed even after passing 2,000 hours as shown in FIG. 4, and it was confirmed that the lasers operated stably.

EXAMPLE 4

Compound semiconductor light emitting devices were produced in substantially the same manner as Example 1 except some modified points that after a passivation layer was formed on the front and rear facets, Ar plasma of the average energy of 110 eV and a current density of 200 $\mu A/cm^2$ was radiated in vacuum of $4\times10^{-5}$ Torr to the facets on which the silicon passivation layer was formed, and successively an amorphous Si serving as the passivation layer was evaporated by about 10 Angstroms in a vacuum of $2\times10^{-7}$ Torr or less using an ordinary electron beam evaporation, and another Ar plasma of the average energy of 120 eV and a current density of 200 $\mu A/cm^2$ was radiated in vacuum of $4\times10^{-5}$ Torr simultaneously with supply of AlOx to the facets in use of the IAD method.

An XPS measurement was carried out to analyze the front facet of a single sample of an obtained compound semiconductor light emitting device. First, the thickness of the AlOx at the front facet is reduced to about 20 Angstroms by a wet etching, and then, the measurement was carried out. The state of the semiconductor laser facet was observed with a photoelectron detection angle of 75°. Neither Ga—O nor As—O is detected though ordinarily existing on (110) plane exposed to air one time.

In use of an angle resolved XPS method, the state of the amorphous Si was searched. As a result, although the film was produced in a good vacuum, it was confirmed that the amorphous Si had SiOx on the interface side to the semiconductor. This is that the oxygen of the oxide remaining at the facets of the compound semiconductor even after the initial plasma irradiation was coupled to Si formed in a film as the passivation layer by the energy of the plasma irradiation during the coating.

From the angle resolved XPS method, it was confirmed that the boundary between the amorphous Si produced as the passivation layer and the AlOx coating layer was partly made into SiOx by oxygen from the AlOx. That is, the layer of the amorphous Si produced as the passivation layer was confirmed as having a structure of SiOx/Si/SiOx from the side of the semiconductor facet. The thicknesses of the respective layers were about 7 Angstroms/15 Angstroms/8 Angstroms.

Figure 6:
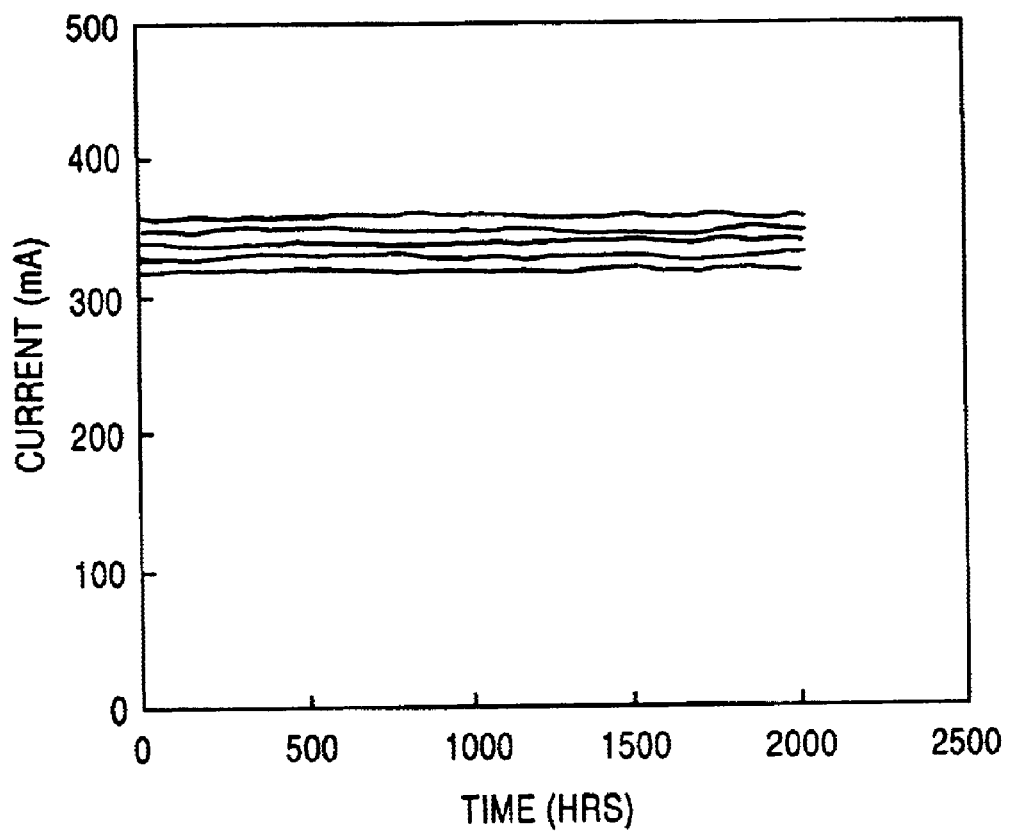
FIG. 6 is aging test results of the compound semiconductor light emitting device of Example 4.

Five compound semiconductor light emitting devices thus produced were mounted on sub-mounts for heat radiation and placed in packages in a nitrogen atmosphere. As the average initial property of the compound semiconductor light emitting devices, the threshold current was 23 mA at 25° C., and kink was observed at 350 mA, 250 mW. To this group, aging test was carried out. As results of an accelerated test of 200 mW, 50° C., no sudden failures were observed even after passing 2,000 hours as shown in FIG. 6, and it was confirmed that the lasers operated stably.

EXAMPLE 5

Compound semiconductor light emitting devices were produced in substantially the same manner as Example 1 except some modified points that after a passivation layer was formed, Ar plasma of the average energy of 110 eV and a current density of 200 $\mu$A/cm$^2$ was radiated in vacuum of $4\times10^{-5}$ Torr to the facets on which the silicon passivation layer was formed, and successively an amorphous Si serving as the passivation layer was evaporated by about 10 Angstroms in a vacuum of $2\times10^{-7}$ Torr or less using an ordinary electron beam evaporation, and subsequently, N$_2$ plasma of the average energy of 130 eV and a current density of 400 $\mu$A/cm$^2$ was radiated in vacuum of $7\times10^{-5}$ Torr simultaneously with supply of Si to the facets in use of the IAD method to produce a SiN to render the reflectance of the front facet 7% and in substantially the same manner for the rear facet, in use of the IAD method to produce a SiN instead of the AlOx to render the reflectance of the rear facet 87%.

An XPS measurement was carried out to analyze the front facet of a single sample of an obtained compound semiconductor light emitting device. First, the thickness of the AlOx at the front facet is reduced to about 20 Angstroms by a wet etching, and then, the measurement was carried out. The state of the semiconductor laser facet was observed with a photoelectron detection angle of 75°. Neither Ga—O nor As—O is detected though ordinarily existing on (110) plane exposed to air one time.

In use of an angle resolved XPS method, the state of the amorphous Si was searched. As a result, although the film was produced in a good vacuum, it was confirmed that the amorphous Si had SiOx on the interface side to the semiconductor. This is that the oxygen of the oxide remaining at the facet of the compound semiconductor even after the initial plasma irradiation was coupled to Si formed in a film as the passivation layer by the energy of the plasma irradiation during the coating.

From the angle resolved XPS method, it was confirmed that the boundary between the amorphous Si produced as the passivation layer and the SiN coating layer was partly made into SiNx by oxygen from the coating layer. That is, the layer of the amorphous Si produced as the passivation layer was confirmed as having a structure of SiOx/Si/SiNx from the side of the semiconductor facet. The thicknesses of the respective layers were about 7 Angstroms/12 Angstroms/11 Angstroms.

Figure 7:
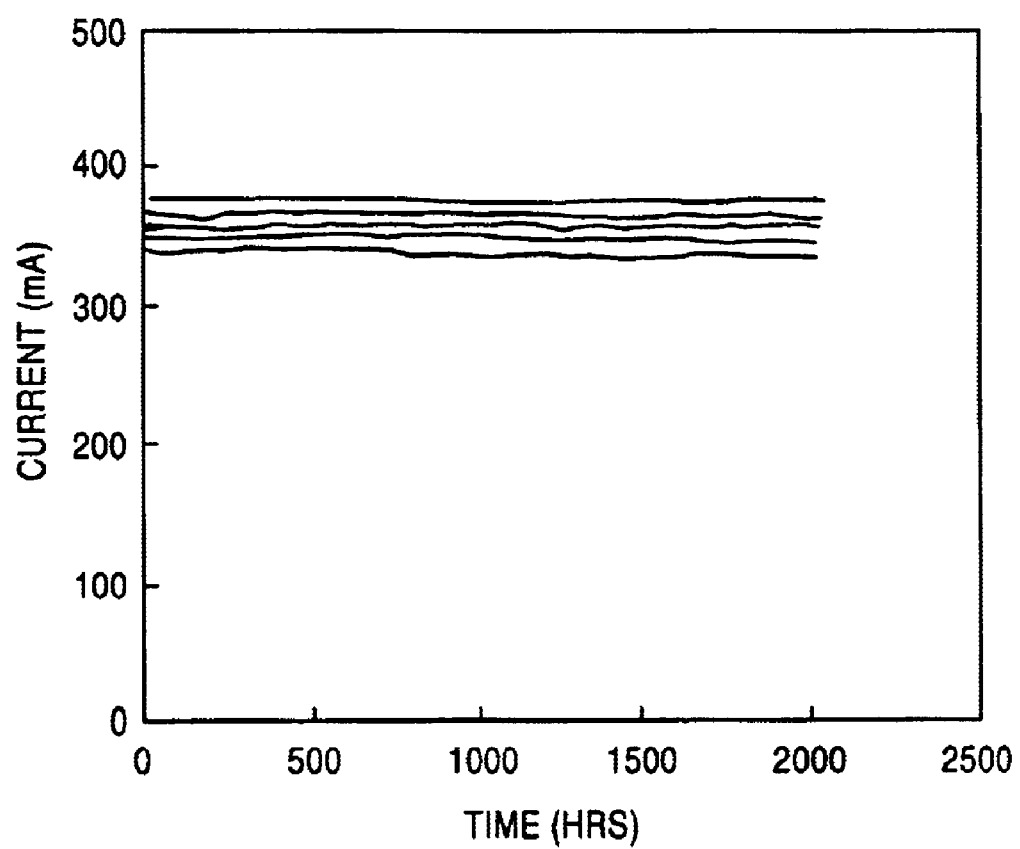
FIG. 7 is aging test results of the compound semiconductor light emitting device of Example 5.

Five compound semiconductor light emitting devices thus produced were mounted on sub-mounts for heat radiation and placed in package in a nitrogen atmosphere. As the average initial property of the compound semiconductor light emitting devices, the threshold current was 27 mA at 25° C., and kink was observed at 350 mA, 235 mW. To this group, aging test was carried out. As results of an accelerated test of 200 mW, 50° C., no sudden failures were observed even after passing 2,000 hours as shown in FIG. 7, and it was confirmed that the lasers operated stably.

COMPARATIVE EXAMPLE 1

Compound semiconductor light emitting devices were prepared in substantially the same manner as Example 1 except some modified points that no formation of the Si passivation layer and no Ar plasma irradiation preceding to this was made on both of the front and rear facets, and that the coating layers are formed not by the IAD method but by an ordinary electron beam evaporation which was made to the entire layers.

Figure 8:
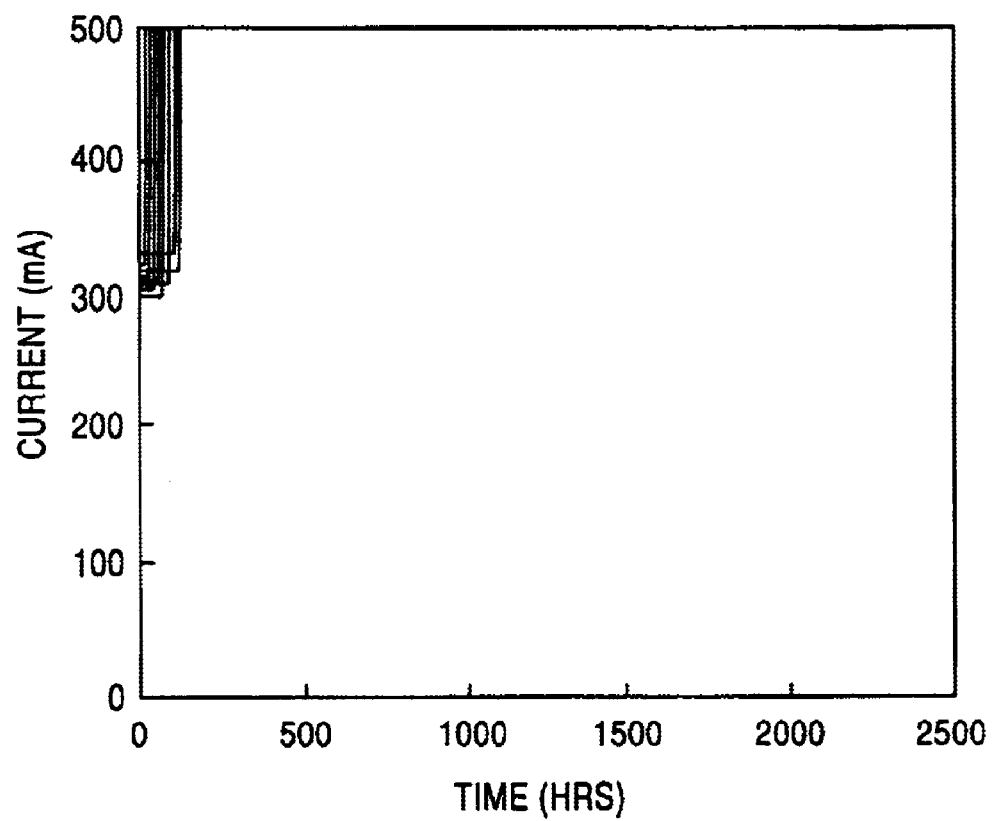
FIG. 8 is aging test results of the compound semiconductor light emitting device of Comparative Example 1.

As the average initial property of the prepared compound semiconductor light emitting devices, in substantially the same manner as Example 1, the threshold current was 23 mA at 25° C., and kink was observed at 350 mA, 250 mW. However, in the aging test (200 mW, 50° C.), ten devices, all, were subject to sudden failure as shown in FIG. 8 by or before passing 100 hours. When the XPS analysis was carried out in substantially the same manner as Example 1, it was confirmed that Ga—O existed at the facets.

COMPARATIVE EXAMPLE 2

Compound semiconductor light emitting devices were prepared in substantially the same manner as Example 1 except some modified points that no formation of the Si passivation layer was made on both of the front and rear facets.

Figure 9:
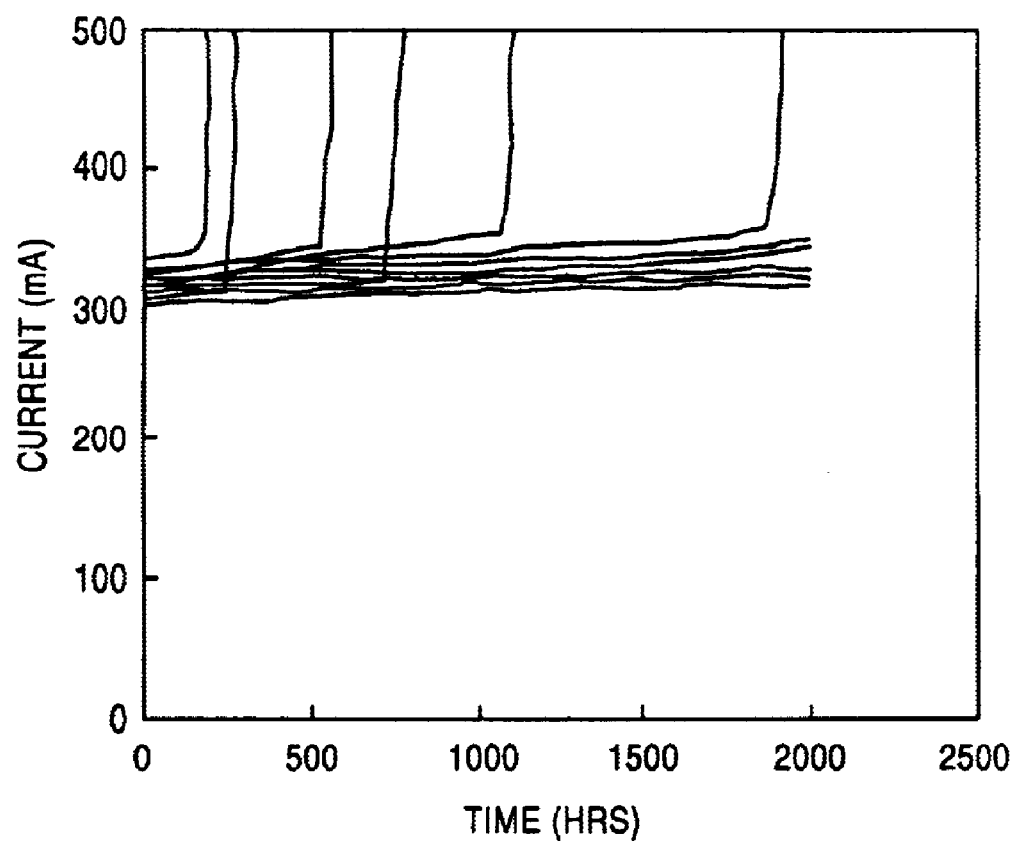
FIG. 9 is aging test results of the compound semiconductor light emitting device of Comparative Example 2.

As the average initial property of the prepared compound semiconductor light emitting devices, in substantially the same manner as Example 1, the threshold current was 23 mA at 25° C., and kink was observed at 350 mA, 250 mW. However, in the aging test (200 mW, 50° C.), six devices among eleven device were subject to sudden failure as shown in FIG. 9 when passing 2,000 hours. The degradation rate is greater than that of Example 1.

COMPARATIVE EXAMPLE 3

Compound semiconductor light emitting devices were prepared in substantially the same manner as Example 1 except some modified points that no Ar plasma irradiation preceding to formation of the Si passivation layer was made on both of the front and rear facets.

Figure 10:
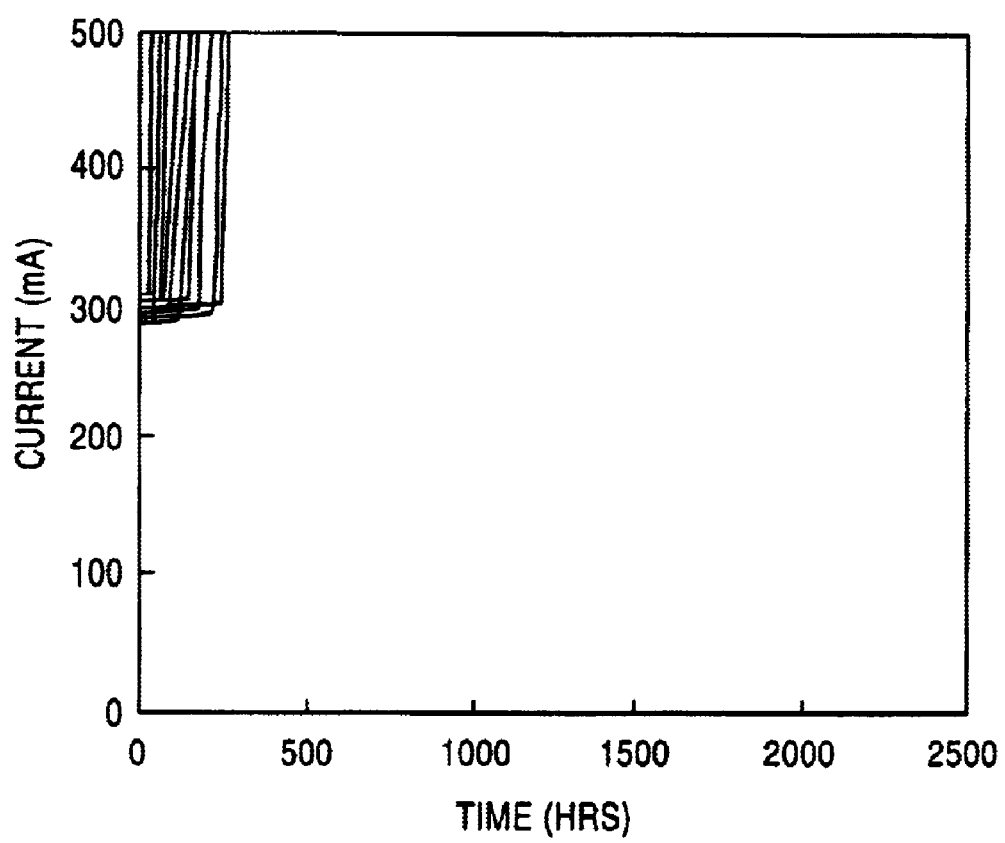
FIG. 10 is aging test results of the compound semiconductor light emitting device of Comparative Example 3.

As the average initial property of the prepared compound semiconductor light emitting devices, in substantially the same manner as Example 1, the threshold current was 23 mA at 25° C., and kink was observed 350 mA, 250 mW. However, in the aging test (200 mW, 50° C.), ten devices, all, were subject to sudden failure as shown in FIG. 10 when passing 250 hours. When the XPS analysis was carried out in substantially the same manner as Example 1, it was confirmed that Ga—O and small amount of As—O existed at the facets.

COMPARATIVE EXAMPLE 4

Compound semiconductor light emitting devices were prepared in substantially the same manner as Example 2 except some modified points that formation of the Si passivation layer and Ar plasma irradiation preceding to the formation were not made on both of the front and rear facets.

Figure 11:
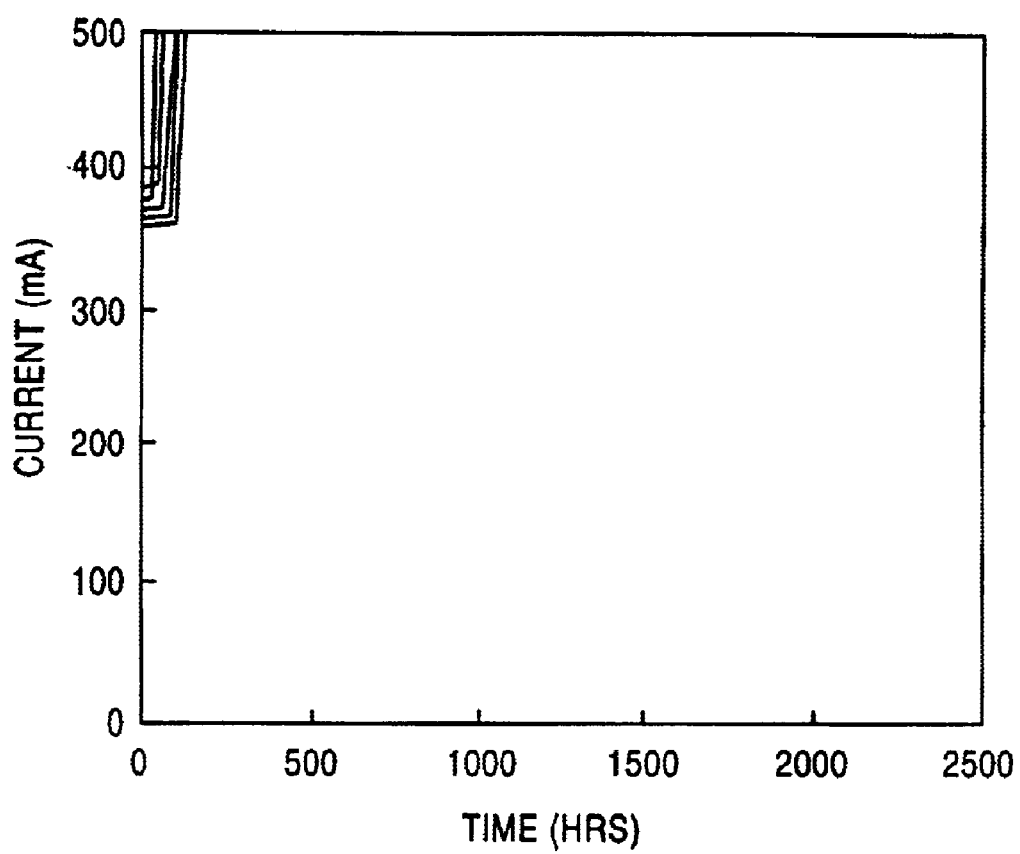
FIG. 11 is aging test results of the compound semiconductor light emitting device of Comparative Example 4.

As results of the aging test (200 mW, 50° C.) given to the prepared compound semiconductor light emitting devices, five devices, all, were subject to sudden failure as shown in FIG. 11 when passing 100 hours.

As describe above, with the compound semiconductor light emitting device according to the invention, the surface state densities at the facets can be stably suppressed for a long time, and the laser devices have a high output, a long lifetime, and a high performance. The compound semiconductor light emitting devices according to the invention have practical advantages in reducing the degradation at the facets and fabrication with a simpler method allowing cleavage in air. Therefore, the compound semiconductor light emitting devices according to the invention provide significant industrial interests and have very wide applicable fields.

What is claimed is:

1. A compound semiconductor light emitting device comprising:
   a substrate;
   a compound semiconductor layer containing a first conductive type clad layer, an active layer, and a second conductive type clad layer, the compound semiconductor layer being formed on the substrate; and a cavity structure formed of two opposing facets of the compound semiconductor layer, wherein surfaces of the first conductive type clad layer, the active layer, and the second conductive type clad layer forming the facet of the compound semiconductor are covered with a passivation layer, wherein at least one element constituting the facet of the compound semiconductor layer is not coupled to oxygen, wherein a portion of the passivation layer adjacent to the facet of the compound semiconductor layer contains oxygen as a structural element in such an amount that the portion is electrically non-conductive, and wherein said passivation layer comprises an oxidation-free layer.

2. The compound semiconductor light emitting device according to claim 1, wherein the passivation layer has a portion excluding oxygen as a structural element.

3. The compound semiconductor light emitting device according to claim 1, wherein the passivation layer excludes any element belonging to 3 through 5 groups.

4. The compound semiconductor light emitting device according to claim 1, wherein the passivation layer includes one or more elements selected from a group of Si, Ge, S, Se, and Al.

5. The compound semiconductor light emitting device according to claim 4, wherein the passivation layer includes Si.

6. The compound semiconductor light emitting device according to claim 5, wherein a portion, in the passivation layer, adjacent to the facet of the compound semiconductor layer is made of SiOx, and the other portion, in the passivation layer, is made of Si.

7. The compound semiconductor light emitting device according to claim 5, wherein a portion, in the passivation layer, adjacent to a facet of the compound semiconductor layer is made of SiOx, and an intermediate portion, in the passivation layer, is made of Si, and a portion, in the passivation layer, adjacent to a coating layer is made of SiOx.

8. The compound semiconductor light emitting device according to claim 5, wherein a portion, in the passivation layer, adjacent to a facet of the compound semiconductor layer is made of SiOx, and an intermediate portion, in the passivation layer, is made of Si, and a portion, in the passivation layer, adjacent to a coating layer is made of SiNx.

9. The compound semiconductor light emitting device according to claim 1, wherein the passivation layer has a thickness Tp (nm) satisfying the following formula (I):

$$0.2 \text{ (nm)} < Tp \text{ (nm)} < \lambda/8n \text{ (nm)} \qquad (I)$$

wherein $\lambda$ denotes an emission wavelength (nm) of the compound semiconductor light emitting device, and n denotes the real part of an average refractive index of the whole passivation layer at the wavelength $\lambda$.

10. The compound semiconductor light emitting device according to claim 1, wherein the surface of the passivation layer is covered with coating layers made of a dielectric or a combination of a dielectric and a semiconductor.

11. The compound semiconductor light emitting device according to claim 10, wherein the coating layers include one or more compounds selected from a group of AlOx, TiOx, SiOx, SiN, Si, and ZnS.

12. The compound semiconductor light emitting device according to claim 10, wherein the coating layers are constituted by a coating layer made of a low reflectance at one end and coating layers of a high reflectance at the other end.

13. The compound semiconductor light emitting device according to claim 12, wherein the coating layer of the low reflectance includes AlOx, and the coating layers of the high reflectance include AlOx and Si.

14. The compound semiconductor light emitting device according to claim 10, wherein a portion of the passivation layer adjacent to the coating layer includes oxygen as a structural element.

15. The compound semiconductor light emitting device according to claim 1, wherein the facet of the compound semiconductor layer is (110) plane and or crystallographically equivalent planes.

16. The compound semiconductor light emitting device according to claim 1, wherein the facet of the compound semiconductor layer is exposed to plasma irradiation before formation of the passivation layer.

17. The compound semiconductor light emitting device according to claim 16, wherein the plasma irradiation includes ion irradiation at energy between 25 eV and 300 eV.

18. The compound semiconductor light emitting device according to claim 1, wherein the surface of the passivation layer is exposed to plasma irradiation before formation of the coating layer.

19. The compound semiconductor light emitting device according to claim 18, wherein oxygen contained as a structural element in the passivation layer is the oxygen immigrated to the passivation layer from the facet of the compound semiconductor layer during plasma irradiation made at a time of formation of the coating layer.

20. The compound semiconductor light emitting device according to claim 1, wherein the active layer includes In as a structural element.

21. The compound semiconductor light emitting device according to claim 20, wherein the active layer includes $In_x Ga_{1-x}As$ ($0 < x \leq 1$) or $(Al_x Ga_{1-x})_y In_{1-y} P$ ($0 \leq x \leq 1$, $0 \leq y < 1$).

22. The compound semiconductor light emitting device according to claim 1, wherein the active layer has a quantum well structure.

23. The compound semiconductor light emitting device according to claim 1, wherein an absolute value of enthalpy of formation of an oxide of an element constituting the passivation layer is greater than an absolute value of enthalpy of formation of an oxide of at least one element constituting a facet of the compound semiconductor layer.

24. The compound semiconductor light emitting device according to claim 1, wherein oxygen contained as a structural element in the passivation layer is the oxygen coupled to the element constituting the facet of the compound semiconductor layer before formation of the passivation layer.

25. The compound semiconductor light emitting device according to claim 24, wherein oxygen contained as a structural element in the passivation layer is the oxygen immigrated to the passivation layer from the facet of the compound semiconductor layer by plasma irradiation made to the passivation layer.

26. The compound semiconductor light emitting device according to claim 24, wherein oxygen contained as a structural element in the passivation layer is the oxygen immigrated to the passivation layer from the facet of the compound semiconductor layer by heat irradiation made to the passivation layer.

27. A compound semiconductor light emitting device according to claim 1, wherein an oxygen-free portion has a thickness of 5 A or more.

28. A compound semiconductor light emitting device according to claim 1, wherein an oxygen-free portion is in the form of layer.

* * * * *